United States Patent [19]

Poustie et al.

[11] Patent Number: 5,796,891
[45] Date of Patent: Aug. 18, 1998

[54] OPTICAL FILTER COMPRISING MULTI-MODE WAVEGUIDES COUPLED IN SERIES

[75] Inventors: Alistair J. Poustie, Ipswich; Neil Finlayson, Felixstowe, both of Great Britain

[73] Assignee: British Telecommunications PLC, London, England

[21] Appl. No.: 646,256

[22] PCT Filed: Nov. 11, 1994

[86] PCT No.: PCT/GB94/02488

§ 371 Date: May 30, 1996

§ 102(e) Date: May 30, 1996

[87] PCT Pub. No.: WO95/13552

PCT Pub. Date: May 18, 1995

[30] Foreign Application Priority Data

Nov. 12, 1993 [EP] European Pat. Off. .............. 93309089
Mar. 10, 1994 [EP] European Pat. Off. .............. 94301705

[51] Int. Cl.$^6$ ...................................................... G02B 6/26
[52] U.S. Cl. ........................................ 385/28; 385/50; 372/6
[58] Field of Search ................................ 385/27, 28, 29, 385/50; 372/6

[56] References Cited

U.S. PATENT DOCUMENTS

| Re. 35,516 | 5/1997 | Henry et al. ................. 385/27 |
| 4,087,159 | 5/1978 | Ulrich ........................ 385/129 |
| 4,176,911 | 12/1979 | Marcatili et al. ............. 385/28 |
| 4,915,468 | 4/1990 | Kim et al. ................... 385/27 |
| 4,974,931 | 12/1990 | Poole et al. ................. 385/28 |
| 5,067,789 | 11/1991 | Hall et al. .................. 385/27 |

FOREIGN PATENT DOCUMENTS

| A 246793 | 11/1987 | European Pat. Off. . |
| 0395060 | 10/1990 | European Pat. Off. ......... 385/28 |
| A 395060 | 10/1990 | European Pat. Off. . |
| A 2634 906 | 2/1990 | France . |
| 5468254 | 6/1979 | Japan ........................... 385/28 |
| 2 215854 | 9/1989 | United Kingdom . |
| 9211550 WO A 92 | 7/1992 | WIPO . |
| 11550 WO A 92 | 7/1992 | WIPO . |
| 11554 | 7/1992 | WIPO . |

OTHER PUBLICATIONS

Horche et al., IEEE Photonics Technology Letters, vol. 1, No. 7, Jul. 1989, New York, pp. 184–187.
Patent Abstracts of Japan, vol. 11, No. 293 (P–619), Sep. 22, 1987; & JP A, 62 089003 (NTT), Apr. 23, 1987.
Poustie et al., Optics Letters, vol. 19, No. 10, May 15, 1994, Washington, pp. 716–718.
Ghera, IEEE Photonics Technology Letters, vol. 5, No. 10, Oct. 1993, New York, pp. 1159–1160.
Chernikov, Electronics Letters, vol. 29, No. 20, Sep. 30, 1993, Stevenage Gb, pp. 1788–1789.

*Primary Examiner*—John D. Lee
*Assistant Examiner*—Ellen E. Kang
*Attorney, Agent, or Firm*—Nixon & Vanderhye, PC

[57] ABSTRACT

An optical filter and method of filtering uses a multi-mode waveguide having a first number n modes and a second waveguide having a different number m modes are coupled in series, where n and m are integers and n>m, and where the interaction of different modes at the interface of the two waveguides filters an optical signal propagating through the waveguides to provide a desired response characteristic. A lateral offset between the central axes of the waveguides at their interface is changed to control the response of the filter. For a multiple wavelength optical source uses, a filter coupled in the optical cavity including a laser gain medium provides interaction of different modes at the interface of waveguides in the filter to filter an optical signal propagating in the cavity thereby providing an output signal with multiple peaks at different wavelengths with a predetermined spacing.

31 Claims, 8 Drawing Sheets

WAVELENGTH (MICRONS)

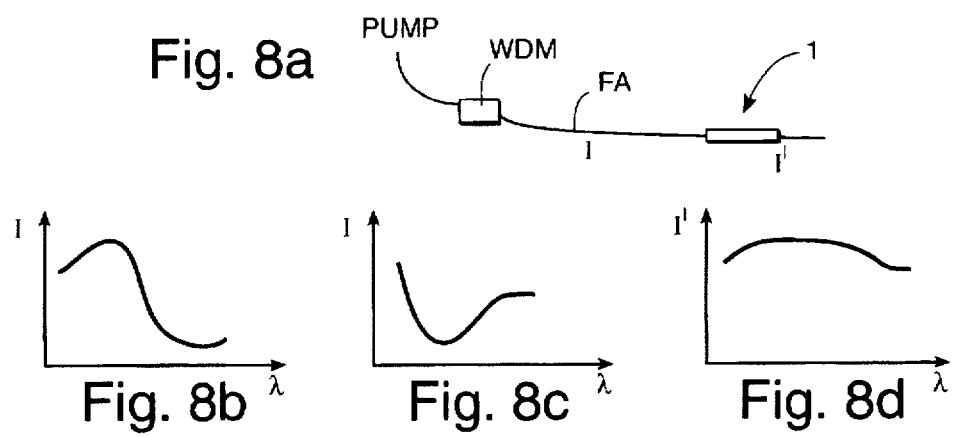
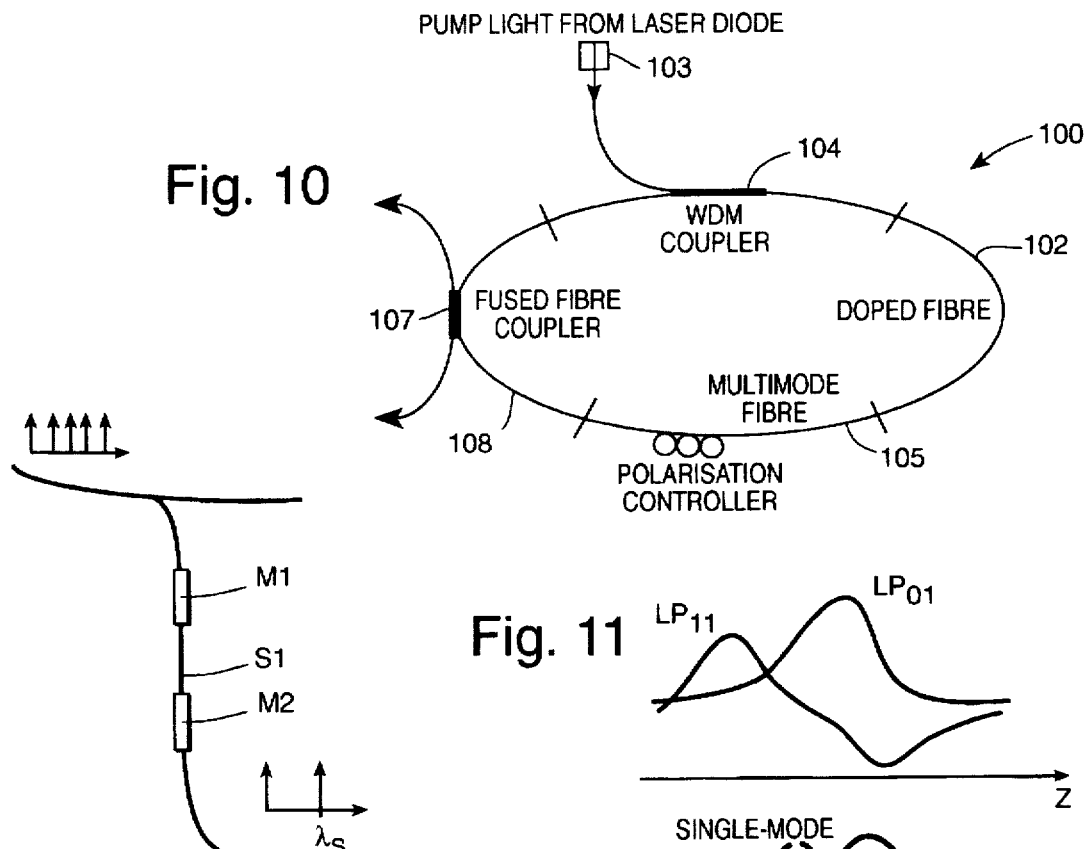
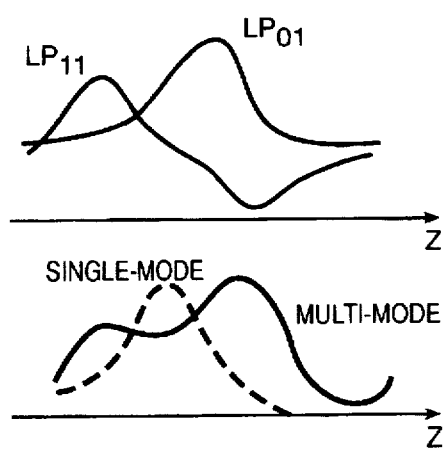

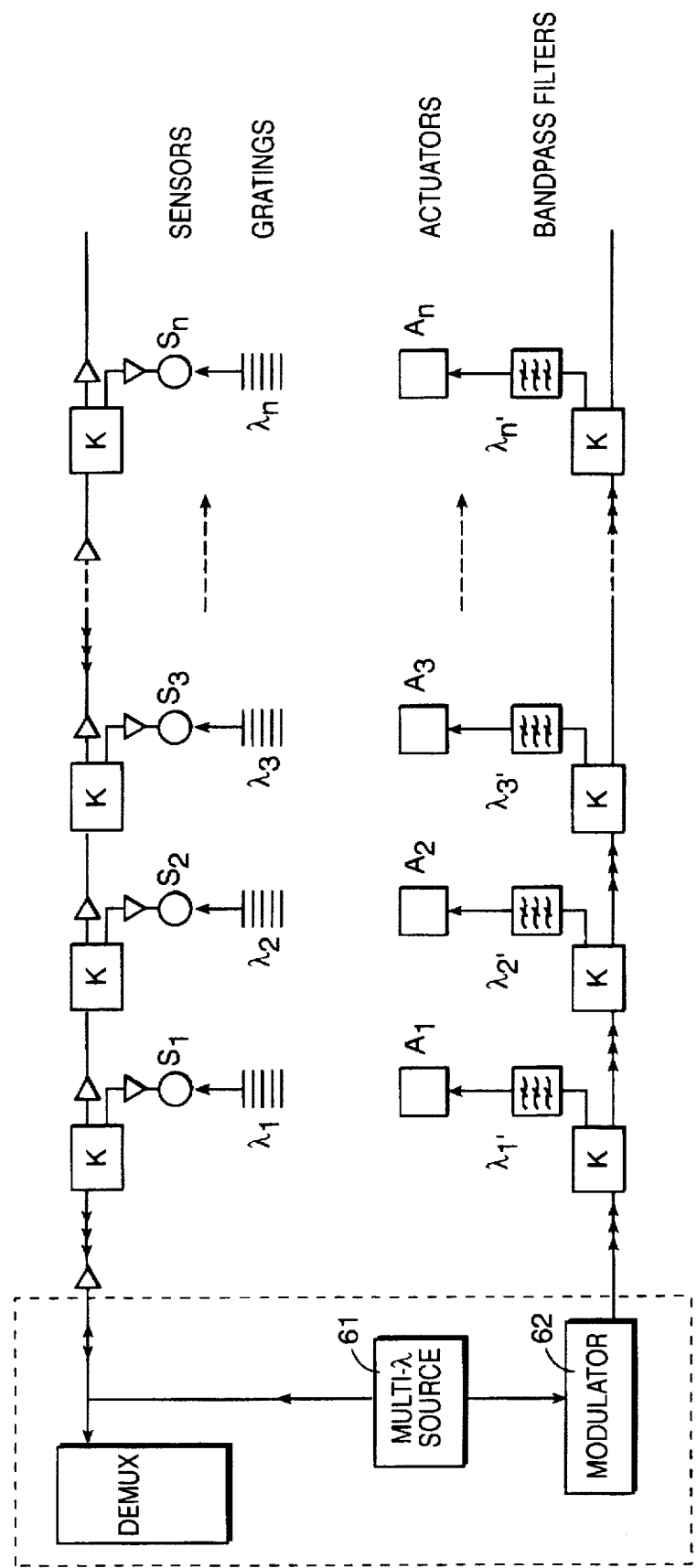

OPTICAL FILTER COMPRISING MULTI-MODE WAVEGUIDES COUPLED IN SERIES

BACKGROUND OF THE INVENTION

The present invention relates to an optical filter suitable for use, for example, in an optical telecommunications system. It also encompasses optical sources using such a filter.

The need to filter a signal to change its intensity as a function of wavelength arises in a number of different situation. For example, some optical sources, such as a rare-earth doped fixture amplifiers have highly uneven gain characteristics. It is desirable therefore to provide an appropriately tailored filter having a generally complementary characteristic to filter the output from such a source - a process known as "gain flattening". As another example, in optical communications systems using wavelength division multiplexing (WDM), precisely tuned filters are required to select a channel or channels from those present in the system.

In designing filters for these purposes there is a need to minimise the costs of fabrication, to ensure that the filter is readily integrable with the other circuits and devices in an optical system, to provide a filter which can be tuned to give a desired response characteristic, and which can maintain that characteristic stably.

A paper by Paloma R. Horche et al published at pp 104–107 of *IEEE Photonics Technology Letters* vol 1, no. 7, Jul. , 1989: "Spectral Behaviour of a Low-Cost All-Fiber Component Based on Untapered Multifibre Unions" describes the spectral characteristics of a system comprising a fibre waveguide of 50 microns diameter supporting multiple spatial modes coupled between input and output single-mode fibre waveguides of 9 microns diameter. The system is found to have an oscillatory power transmission characteristic.

A paper by Uri Ghera et al published at pp 1159–1161 *IEEE Photonics Technology Letters* 5 (1993 Oct., no. 10) "A Fiber Laser with a Comb-Like Spectrum" discloses a laser intra-cavity filter formed by joining an Nd doped fibre to a HiBi fibre. Both fibres are single mode fibres in terms of their spatial modes. The system relies upon the interaction of polarisation modes to produce a comb-filter characteristic.

SUMMARY OF THE INVENTION

According to a first aspect of the present invention, an optical filter comprising a multi-mode waveguide having a first number n modes and a second waveguide having a different number m modes coupled in series, where n and m are integers and n>m, the interaction of different modes at the n-mode/m-mode interface being effective to filter an optical signal propagating through the waveguides to provide a desired response characteristic, is characterised by means for changing a lateral offset between the central axes of the waveguides at their interface thereby controlling the response of the filter.

By a lateral offset is meant an offset in the direction perpendicular to the longitudinal central axis of the waveguides.

Preferably the second waveguide is a single-mode waveguide.

The present invention uses spatial-mode beating between a multiple-mode waveguide and, e.g., a single-mode waveguide to provide a filter which can readily be configured to give a desired response characteristic. Waveguides, be they fibre waveguides, planar devices or semiconductor devices, form the basic building blocks of most optical communications systems or optical signal processing devices. The filter of the present invention can therefore very readily be incorporated in such systems and can be manufactured using the conventional technologies developed for such systems. A further important advantage of the present invention is that the filter response is variable in response to a change in the offset between the waveguides.

Changing the offset between the waveguides at their interface has the effect of changing the extent to which the different modes in the multiple-mode waveguide are excited. For example, by adjusting the offset it is possible to change the filter from having a transmission peak at a particular characteristic wavelength to having a transmission minimum at that wavelength.

The filter may comprise a plurality of multi-mode waveguides coupled in series. The multi-mode waveguides may be coupled together directly, or there may be an intervening section of single-mode waveguide.

The use of two or more multi-mode waveguides in series facilitates the selection of a single wavelength from a comb of wavelengths. In general each of the multi-mode waveguide will be of a different length, and so will have a different characteristic wavelength spacing. The transmission peaks of two multi-mode waveguides may be arranged to coincide at the wavelength which is to be selected but otherwise to fall at different wavelengths thereby ensuring that overall only the selected wavelength is transmitted.

According to a second aspect of the present invention there in provided a rare-earth doped fibre amplifier, and an optical filter according to the first aspect of the present invention connected to the output of the rare-earth doped fibre amplifier, the filter thereby providing gain flattening.

According to a third aspect of the present invention a method of filtering an optical signal comprising driving with the optical signal a medium supporting n modes at the wavelength of the signal, and coupling the output of the medium to a second medium supporting a different number m modes at the wavelength of the signal, where n and m are positive integers and n>m, the interaction of the modes at the n-mode/m-mode interface being effective to filter the signal providing a desired response characteristic, is characterised by changing the lateral offset between the central axes of the waveguides at their interface to provide a different desired response characteristic.

According to a fourth aspect of the present invention there is provided a multiple wavelength optical source comprising an optical cavity including a laser gain medium and means for outputting a signal from the optical cavity, characterized by a filter in accordance with the first aspect coupled in the optical cavity, the interaction of different modes at the multiple-mode/single-mode interface being effective to filter an optical signal propagating in the cavity to provide an output signal with multiple peaks at different wavelengths with a predetermined spacing.

It is well known to use a laser formed from a gain medium in an optical cavity provided by a waveguide. The gain medium may be provided, for example, by a rare-earth doped optical fibre spliced to a single-mode fibre waveguide configured as a ring. Where multiple wavelengths are required it is possible to take the output from such a ring and to apply it to an external filter, such as an etalon cavity. However there are inevitably losses in coupling the output to an external device and the use of an external filter adds undesirably to the bulk and complexity of this system. It would be desirable therefore to provide a source capable of intrinsically generating an output simultaneously comprising peaks at multiple wavelengths.

This aspect of the prevent invention provides a simple device which intrinsically generates an output signal having a comb-filter characteristic. That is to say, the output has several regularly-spaced peaks. As further discussed below, spatial mode beating between different modes in the multi-mode waveguide acts as a filter to allow several well defined wavelengths to oscillate in the optical cavity simultaneously. The filtering occurs because the mode field overlap at the multi-mode/single-mode interface depends on the spatial beat length between the modes, and the length of the multi-mode waveguide.

The gain medium may be provided by a rare-earth doped optical fibre. Conventionally such fibre lasers are single-mode devices, in which case the fibre laser may be coupled to a multi-mode fibre to provide the required multi-mode/single-mode interface. Alternatively, the doped fibre may itself be a multi-mode fibre, in which case it is coupled to a single-mode fibre.

Alternatively, the gain medium and/or, the waveguides may be formed in a planar structure of the type described in the present applicants earlier applications nos. GB 9202463.7 and GB 9024022.7. These may comprise, e.g. a doped silica waveguiding structure formed on a silicon is substrate. A hybrid structure with a fibre waveguide coupled to a planar waveguide is found to be particularly advantageous. The use of a planar structure facilitates precise selection of waveguide parameters such as waveguide diameter and refractive index gradient, which in turn allows tailoring of the characteristics of the interface with the fibre waveguide. The use of optical fibre for the other of the waveguides facilitates integration of the filter with other optical-fibre based circuits and components. This hybrid filter structure may be used in combination with, or independently of, the changing of the lateral offset characteristic of the first aspect of the present invention.

As a further alternative, the gain medium may be provided by a semi-conductor laser amplifier. The single-mode and multi-mode waveguides may then also be formed in solid-state devices, or alternatively the semi-conductor laser amplifier may be coupled to an external fibre cavity in which case, either or both of the single-mode and multi-mode waveguide may be provided by the optical fibres. In some circumstances it may be desirable to control dynamically the centre wavelength and/or the spacing of the peaks of the output signal. This may be achieved by increasing the optical power in the laser cavity to exploit the non-linear regime of the multi-mode fibre. It may be preferred however to use an electro-optic material such as $LiNbO_3$. An electric field is then applied to the material to change the refractive indices and hence the transmission wavelengths.

According to a fifth aspect of the present invention, a WDM optical communications system comprising a multiple wavelength source, and means for modulating different channels on different respective wavelengths from the multiple wavelength source is characterised in that the multiple wavelength source comprises a laser having a multiple-mode waveguide and a single-mode waveguide coupled in series in the optical cavity of the laser, the interaction of different modes at the single-mode/multiple-mode interface being effective to filter an optical signal propagating in the cavity to provide an output signal with multiple peaks at different wavelengths corresponding to the different WDM channels.

The inventions of the fourth and fifth aspects may be used in combination with, or independently of the offset adjustment of the first aspect.

BRIEF DESCRIPTION OF DRAWINGS

Examples of systems embodying the present invention will now be described by way of example only with reference to the accompanying drawings in which:

FIG. 8c is a filter embodying the present invention connected to the output of a fibre amplifier and FIGS. 8b to 8d are intensity/wavelength characteristics for the output signal, the filter, and the modified output signal respectively;

FIG. 9 is a schematic of a filter embodying the present invention used in the selection of a wavelength channel;

FIG. 10 shows a fibre ring laser embodying the invention;

FIG. 11 is a diagram illustrating field profiles in single-mode and multiple-mode waveguides;

FIG. 13 is a diagram showing a WDM network;

DESCRIPTION OF EXAMPLES

An optical filter 1 (FIG. 5) comprises a single-mode waveguide W1 butt-coupled to a second waveguide W2 capable of supporting two modes. A third waveguide W3 is in turn butt-coupled to the other end of the second waveguide W2 to pick up the transmitted light.

There is an offset between the axis of the second waveguide W2 and the single-mode waveguides W1, W3. This offset can be varied using a piezo-electric element 2 to displace the second waveguide W2.

In the present example, the single-mode waveguides W1, W3 have a core diameter of 8 μm with a core/cladding refractive index difference of $\delta n=0.004$ for an operating wavelength of 1.55 μm. The multi-mode waveguide in this example has a V-value (normalised frequency) of 2.8. This may be obtained, for example, using a core diameter of 3.3 μm and a core/cladding refractive index difference of $\delta n=0.015$ at the operating wavelength of 1.55 μm.

The relative lengths of the single-mode and multi-mode sections, and the offset between them, is varied according to the filter characteristics required.

Figure 1A:
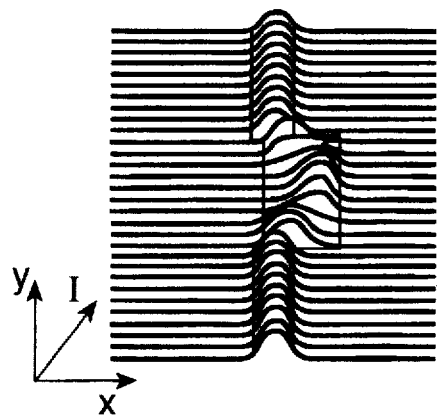
FIGS. 1a and 1b are schematics showing field intensities in a filter embodying the present invention at two different wavelengths.
Figure 1B:
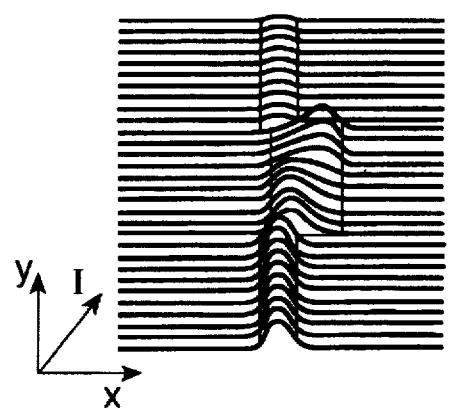
Figure 5:
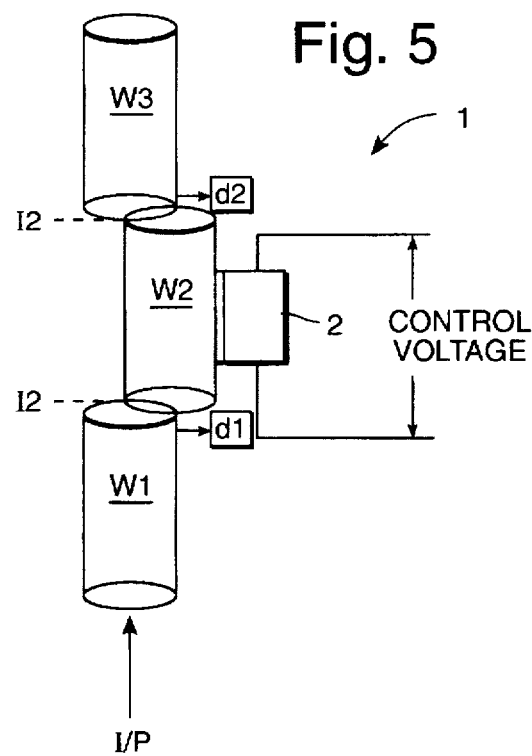
FIG. 5 is a schematic of a filter embodying the prevent invention.

FIGS. 1a and 1b show the optical field intensity profiles in the filter of FIG. 5 at two different wavelengths L1, and L2. In the Figure the x and y dimensions correspond to the transverse and longitudinal spatial dimensions of the waveguide and the dimension labelled I, out of the plane of the paper is the field intensity. At wavelength L1 shown in FIG. 1a, the dual-mode section W2 is n beatlengths long and the filter passes radiation. At wavelength L2 shown in FIG. 1b, the dual-mode W2 section is n-½ beatlengths long and so radiation is not coupled from the dual-mode filter to the output single-mode filter. Accordingly at this wavelength there is a minimum in the transmission characteristic of the filter. In such an embodiment the characteristics of the filter can be tuned using a fibre polarisation controller, facilitating selection of any desired wavelength. The multi-mode waveguide may be wound around a polarisation controller such as model MPC 1000 from BT & D. This makes it possible to vary the optical path length as necessary to tune the filter to the desired wavelength.

These effects and their dependence on the length of the waveguides and their offset are discussed in further detail below.

Figure 6A:
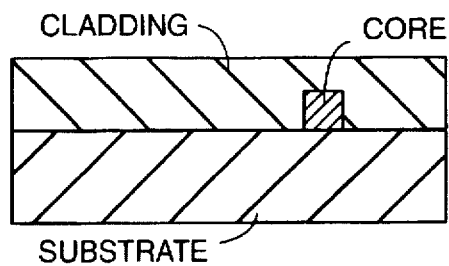
FIG. 6a is a cross-section through a planar waveguide and FIG. 6b a plan view of the planar waveguide device used in an alternative embodiment of the present invention.
Figure 6B:
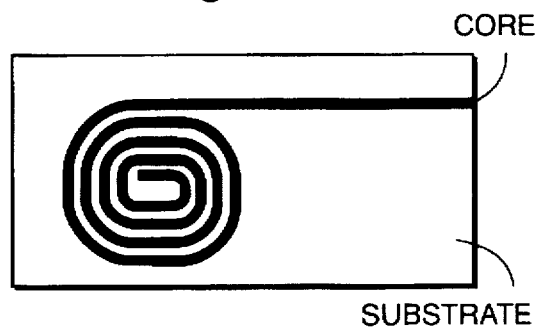

Although in this first example fibre-waveguides are used the invention is by no means limited in this respect. FIG. 6a is a cross-section through a planar waveguide and FIG. 6b a plan view of the planar waveguide device used in an alternative embodiment of the present invention. This structure may be formed using chemical vapour deposition (CVD) or flame hydrolysis techniques, as described in the present applicant's earlier applications numbers GB 9202463.7 and GB 9024022.7. Using these techniques, a doped silica waveguiding structure in formed on a silicon substrate. The planar structure is formed with a first length having a core configured as a single-mode waveguide, a second length configured as a dual-mode waveguide, and a third length again configured to carry a single-mode only. As in the first example discussed above, the interaction between the modes in the different waveguides at their interfaces is effective to provide a required filter-characteristic for the structure as a whole. The dimensions of the different doped-silica cores in the planar structure may be the same as the dimensions of the cores of the fibre waveguides of the first example. That is to say, the single-mode portion has a thickness of 8 µm and δn=0.004 for operation at 1.5 µm, and the multi-mode section has a thickness of 3.3 µm and δn=0.015 to give a V-value of 2.8.

Figure 7:
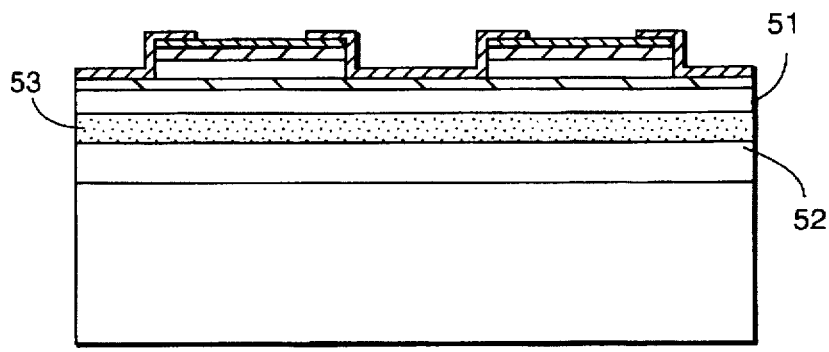
FIG. 7 is a further alternative embodiment.

As a further alternative, the filter may be realised using a semiconductor waveguide structure., In the example shown in FIG. 7, the semiconductor is a buried heterostructure comprising an InP cladding 51, 52 with an InGaAsP core 53. In this case, the core dimensions are about 0.15 µm by 1.1 µm for the single-mode guide and 0.15 µm by 2 µm for the multi-mode guide.

FIG. 8a shows a filter embodying the present invention used in combination with a fibre amplifier FA for gain-flattening. In this example, the fibre amplifier is an $Er^{3+}$-doped single-mode fibre pumped by a 1480 nm laser diode source. The pump is coupled into the doped fibre by an WDM coupler. The WDM coupler in this example is a bi-directional device incorporating an interference filter formed as an evaporation-deposited stacked dielectric. One wavelength passes straight through the filter while another wavelength is reflected. An appropriate device having these properties in available commercially from the company JDS FITEL as WDM coupler model no. WD1515Y-A1. At the interfaces, the fibres may be mounted on fibre holders on movable stages, as described in further detail below with reference to FIG. 15. The stages may be driven to adjust the offset.

The untreated output from the fibre amplifier has a highly uneven gain characteristic of the form shown in FIG. 8b. To provide a filter to flatten this gain characteristic, a section of dual-mode fibre is butt-coupled to the single-mode fibre carrying the output signal. The length and transverse offset of the dual-mode fibre are chosen in accordance with the criteria discussed below, so that the filter has a characteristic as shown in FIG. 8c generally complementary to the gain-characteristic of the amplifier. The output from the filter I' has a flattened characteristic as shown in FIG. 8d.

FIG. 9 shows another use of a filter embodying the present invention. In this example, the filter is used at a passive node in a wavelength-division multiplexed optical network to select a wavelength carrying a particular channel. In this example, the filter comprises a first length M1 of multi-mode fibre, an intervening section S1 of single-mode fibre and a second length M2 of multi-mode fibre. The interface between the first length of multi-mode fibre and the single-mode fibre provides a first filter having a comb-characteristic with a predetermined spacing between the transmission peaks. The interface between the second multi-mode fibre and the single-mode fibre provides a second filter again with a comb-characteristic with a predetermined spacing, but in this case the spacing is different from that in the first filter. The characteristics of the first and second filter are chosen so that the transmission peaks overlap only for the one wavelength $\lambda_g$ which is to be selected, and are out of alignment at all other wavelength positions. In this manner, the filter as a whole transmits only the selected wavelength channel.

In the examples so far described, the multi-mode waveguide supports two modes. As an alternative the multi-mode waveguide may be arranged to support three or more modes. In this case, for use at a given wavelength, the waveguide will have increased core dimensions and/or an increased index differential. The different waveguides may all be multi-mode devices. For example W1 and W3 of FIG. 5 may be a dual-mode waveguide and W2 a 3-mode waveguide. As before, the overlap at the interface determines the filter characteristics.

Figure 15:
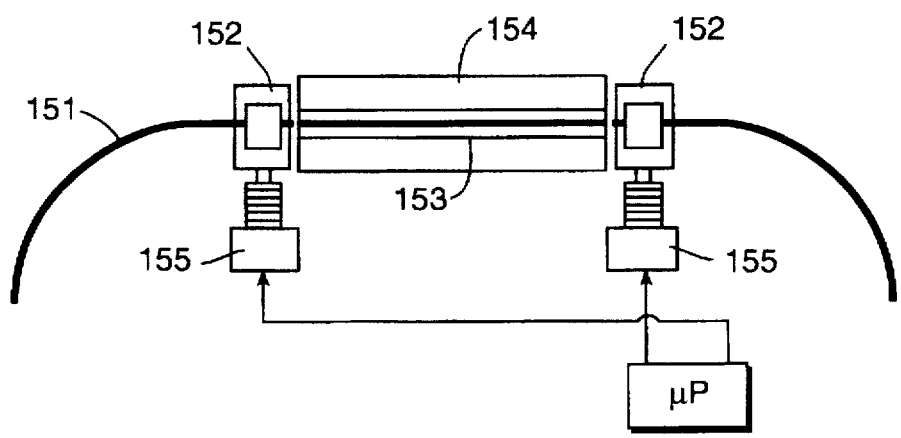
FIG. 15 shows a hybrid planar/fibre filter.

FIG. 15 shows a hybrid filter structure in which the single mode waveguides are optical fibre waveguides, and the multimode waveguide is a planar silica waveguide. The input single mode optical fibre waveguide 151 is terminated on a adjustable stage 152 such as that available commercially as Newport ULTRAlign 561D-YZ positioner with 561-FH fibre holder. The end of the fibre waveguide is then butt-coupled to a multimode planar silica waveguide 153 formed on a silicon substrate. This planar device is mounted on a stage such as that available commercially as photon control DM4 device manipulator. Similarly the output from the other end of the planar waveguide is butt-coupled to an optical fibre mounted on a fibre holder/positioner. The positioners are driven by respective stepper motors 155 controlled by a microprocessor to change the lateral offset between the single mode optical fibres and the multimode planar silica waveguide as necessary when it is desired, for example, to switch the filter from a transmission maximum to a transmission minimum at a given wavelength.

In the filters discussed above with respect to FIGS. 5 to 9, the filter action depends upon the interference occurring between two modes of the dual-mode waveguide section. As discussed above, a single-mode waveguide is butt-coupled to a waveguide capable of supporting two modes. An discussed in further detail below the efficiency with which the optical signal in the multi-mode fibre is coupled to or from the preceding and following single-mode fibres depends on the overlap between the field profile in the multi-mode fibre and in the single-mode fibre. As shown diagrammatically in, FIG. 11, the field profile in the multiple-mode fibre is determined by spatial mode beating between the $LP_{01}$ and $LP_{11}$ fibre modes. The shape of the resulting spatial field distribution, and hence the overlap at the interface with the single-mode fibre is wavelength-dependent with a periodicity which varies with the length of the multiple-mode fibre. A third waveguide supporting a single-mode is used to pick up the transmitted light.

The first interface (interface 1) forces the incoming single-mode beam $a_0$, to split between the two modes of the second waveguide, to a degree governed by the overlap integrals:

$$\pi_{00} = \frac{|\int a_0 b_0^* dx|^2}{\int a_0 a_0^* dx \int b_0 b_0^* dx} \quad (1a)$$

$$\pi_{01} = \frac{|\int a_0 b_1^* dx|^2}{\int a_0 a_0^* dx \int b_1 b_1^* dx} \quad (1b)$$

where $b_0$ and $b_1$ are zeroth and first order TE modes of the second waveguide section. A residual amount of light in also coupled to radiation modes at each interface. We neglect these in the following discussion although they can contribute significantly to the overall insertion loss. The two modes of waveguide 2 propagate independently over a distance L to interface 2 according to the formula $$E(x) = b_0 \Phi^{i\beta_0 x} = b_1 \Phi^{i\beta_2 y} \quad (2)$$

where $\beta_0$, $\beta_1$ are the propagation constants of the two modes.

The total field E(L) at interface 2 projects onto the single mode $c_0$ of the output waveguide according to the overlap integral $$\pi_{10} = \frac{|\int E(L) c_0^* dx|^2}{\int E(L) E(L)^* dx \int c_0 c_0^* dx} \quad (3)$$

It is evident from equation (2) and (3) that the degree of overlap at the second interface for given waveguide offset setting is a function of the relative optical path lengths traversed by the two modes. Waveguide dispersion ensures that this optical path length is dependent on the optical frequency so that the device acts as a filter (we assume in the model that material dispersion is small by comparison). For certain wavelengths the beating of the two modes in the dual-mode section is such that the total field at interface 2 projects efficiently onto the output field. Such a situation is depicted in FIG. 1a. For other wavelengths, the optical path-length of the dual-mode section gives rise to destructive modal interference at interface 2 which makes the resultant projection onto the single-mode of the third waveguide less efficient (FIG. 1b). Thus the structure comprising interface 1, the dual-mode waveguide and interface 2 constitutes an interference filter.

The contrast arising from interferometric mode-beating in waveguide 2 is governed by overlap integrals at interface 1. These overlap integrals are determined by the relative offset $d_1$ of the first two waveguides. Maximum contrast occurs where the input field projects equally onto both modes of waveguide 2. For any given wavelength the transmission can be continuously varied from a maximum by changing either of the transverse offsets $d_1$ and $d_2$. The dispersion associated with propagation in waveguide 2 determines the spectral period of the filter. In general, this period in itself a function of frequency although a constant period can be obtained over a useful frequency range.

We now present theoretical results based on the above model. We assume a slab waveguide model, with propagation constants calculated according to standard transcendental equations. The background refractive index $n_0$ is 1.5, the waveguide index $n_1$ is 1.516 and a fixed single-mode waveguide width of 3.86 µm is assumed. The length of the dual-mode section 2 is 55.3 mm and the wavelength is varied between 1.5 µm and 1.6 µm. The first offset is chosen to be 3.0 µm which generates a 52/48 ratio between the intensities in mode $TE_0$ and $TE_1$ in the dual-mode section.

$L_B$ is calculated directly from propagation constant dispersion curves according to the formula $$L_B(\lambda) = \frac{\lambda}{n_0(\lambda) - n_1(\lambda)} \quad (4)$$

Figure 2A:
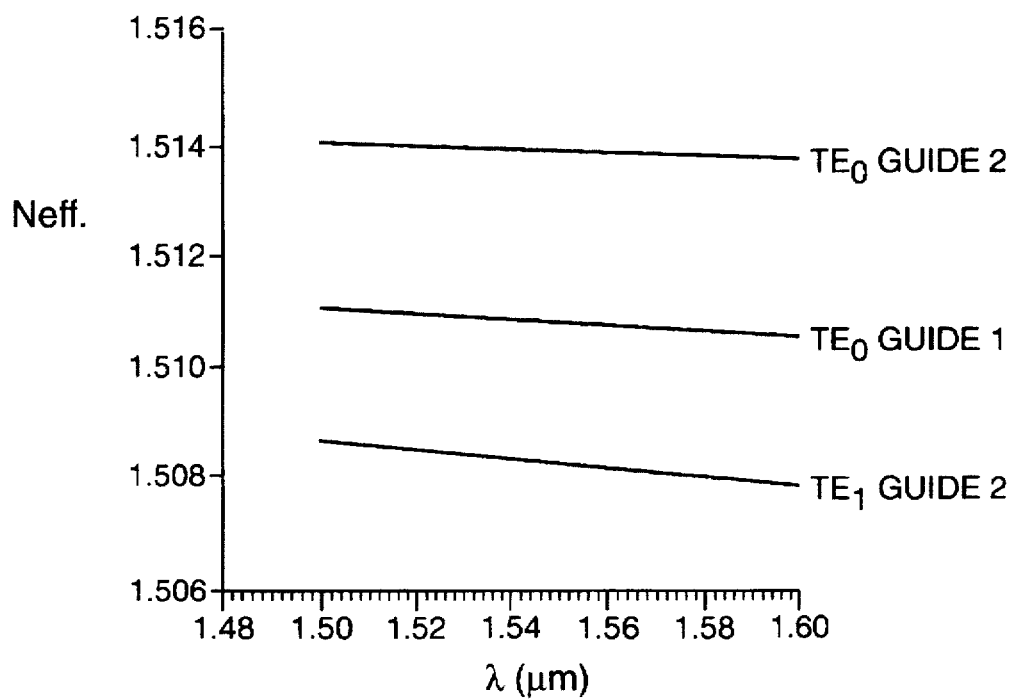
FIG. 2a shows the variation of refractive index with wavelength arising from slab waveguide dispersion and FIG. 2b shows the consequent variation of the optical path length of the two-mode section with wavelength.
Figure 2B:
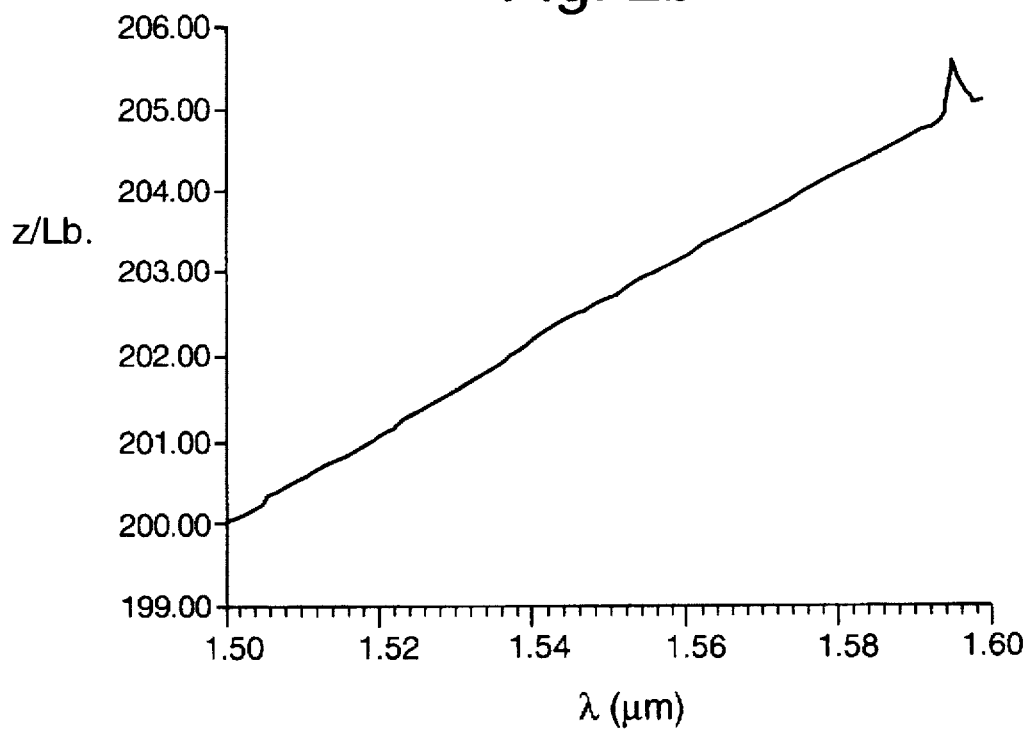

The variation of $n_0(\lambda)$ and $n_1(\lambda)$ with wavelength is shown in FIG. 2(a). The normalised optical path length $L_N(\lambda)$ of the two-mode section is given by $$L_N(\lambda) = \frac{L}{L_B(\lambda)} \quad (5)$$

where L is the length of the dual-mode section. $L_N(\lambda)$ in shown as a function of wavelength in FIG. 2(b). Maximal transmission occurs where $L_N(\lambda)$ is an integer, and minimal transmission occurs at the half-integer points.

Figure 3:
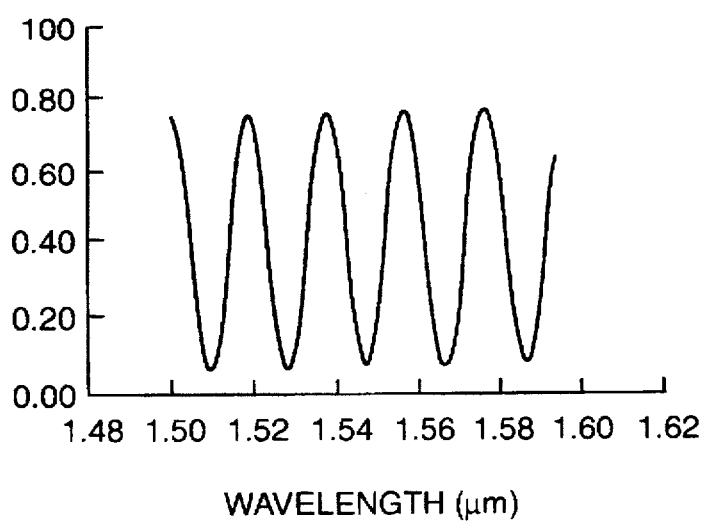
FIG. 3 shows the theoretical transmission function of the filter as a function of wavelength.
Figure 4A:
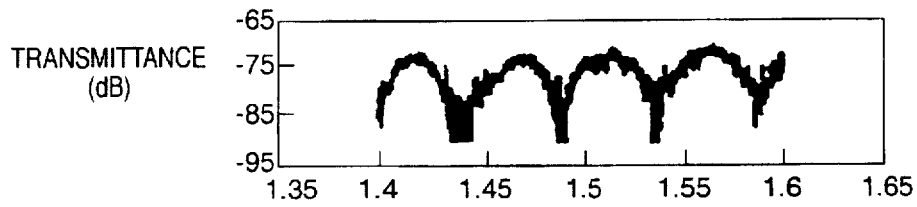
FIGS. 4a to 4g show experimental values of the transmission function for different input offset positions.
Figure 4B:
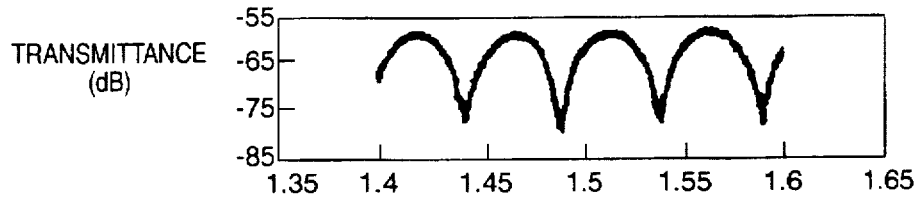
Figure 4C:
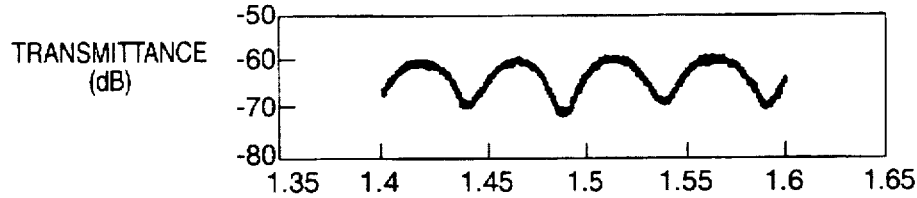
Figure 4D:
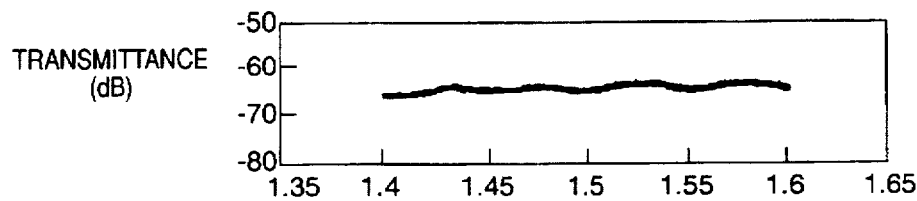
Figure 4E:
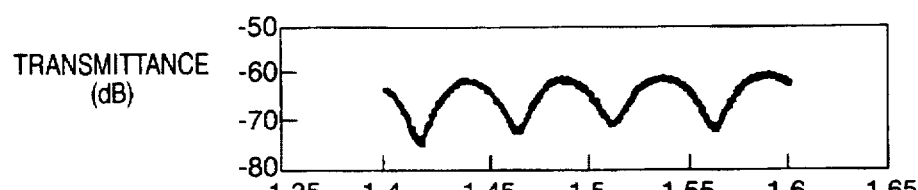
Figure 4F:
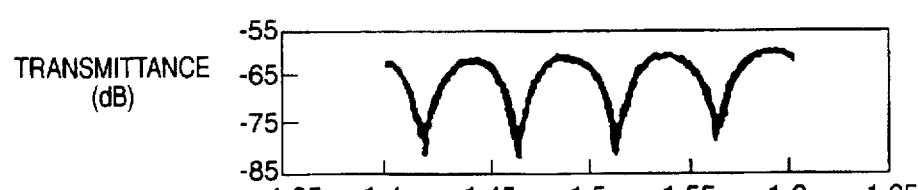
Figure 4G:
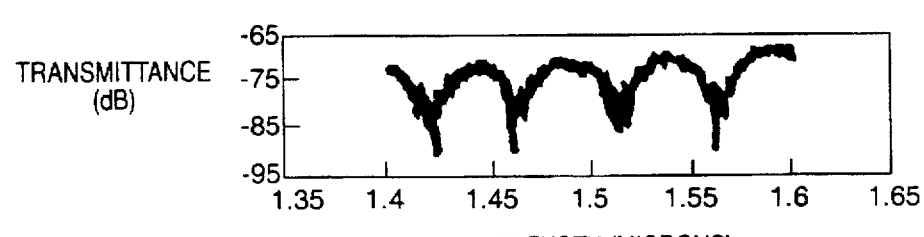

The filter transmission function as a function of wavelength is shown in FIG. 3. We see that a contrast of out 11dB in available from this filter, if the input offset is chosen such that both modes are about equally excited at the first interface. In addition, we see that the complementary transmission function can be achieved if the input offset is chosen to have opposite sign while fixing the output offset. Changing the offset from values which equally excite the two modes of the dual-mode section reduces the contrast of the device, as a result of incomplete interference between the two modes.

These theoretical results were tested by constructing a working device using fused silica waveguides. The multiple-mode planar waveguide was formed using a combination of flame hydrolysis deposition and reactive ion etching. The core index was 1.456 and the cladding index 1.446 measured at 1.523 µm. The multiple-mode waveguide section was 15 µm wide by 5 µm deep and 45 mm long. Standard single-mode fibres were used for launch and recovery. A white light source was used to probe the transmission function of the device. The input waveguide was moved in discrete steps with respect to the dual-mode section resulting in filter transmission functions as shown in FIGS. 4a–g that closely resemble those of the theory.

As well as having utility as a discrete external filter element, filters embodying the present invention may be incorporated, for example, within the optical cavity of a fibre ring laser to provide an optical source having a desired output characteristic. In particular such a system may be arranged to provide a multiple-wavelength source.

FIG. 10 shows an example of one such laser arranged to provide a multiple-wavelength source. The laser 101 is formed from optical fibres coupled in a ring configuration. The active medium is provided by a rare-earth doped silica fibre 102. Pump light for the active medium is generated by a laser diode 103 and coupled into the ring via a WDM coupler 104. The output of the rare-earth doped fibre is connected to a multi-mode fibre 105. A polarisation controller 106 is associated with the multi-mode fibre 105, or alternatively may be placed elsewhere in the fibre loop. An appropriate device is available commercially from BT&D as model no. MPC1000. The loop in completed by conventional single-mode silica fibre 108. A single-mode fused fibre coupler 107 acts an the output coupler for the laser 101.

Figure 12A:
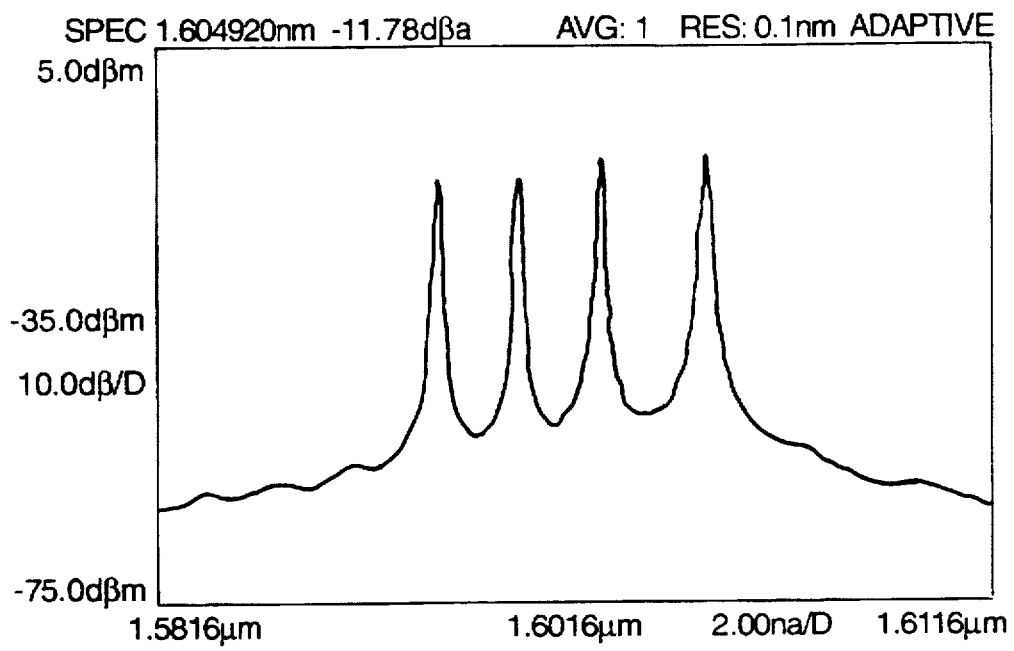
FIGS. 12a and 12b are output spectral for the laser of FIG. 1.
Figure 12B:
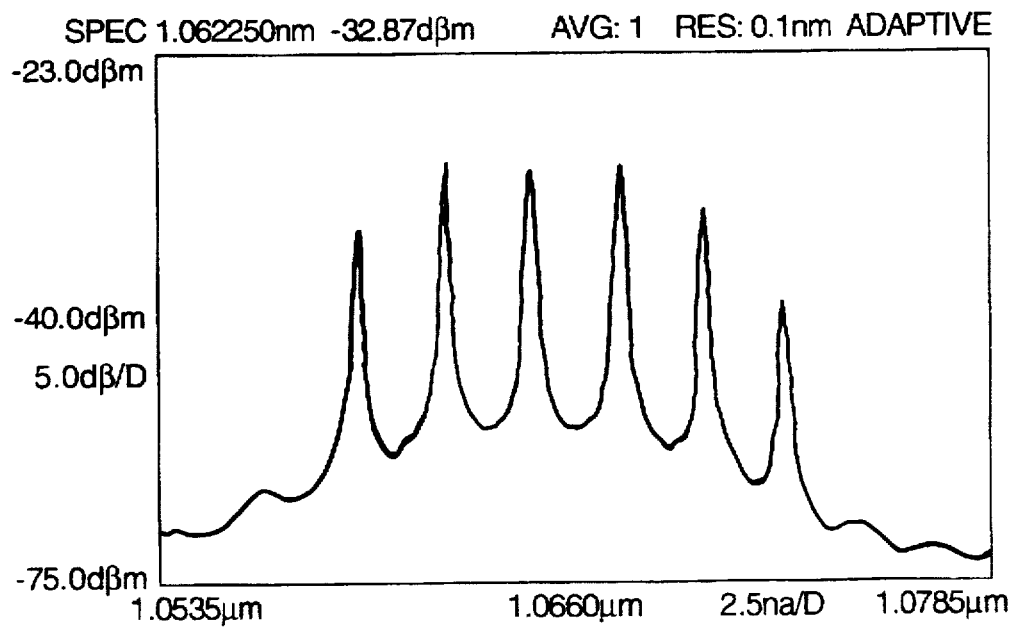

A first version of this circuit was constructed using a single-mode 50 m length of $Er^{3+}$doped fibre as the gain medium. The pump in this instance was provided by a 1480 nm laser diode. The output obtained from the system is shown in FIG. 12a. In a second version, a 3 m length of $Nd^{3+}$-doped single-mode silica fibre was used as the gain medium. In this case the pump was an 810 nm laser diode. FIG. 12b shows the output for this version of the circuit. In both cases it in seen that the output has a characteristic comb-filter profile.

For circuits of the type described above, a typical value for the core diameter is 8 μm with a core/cladding refractive index difference of $\Delta n=0.004$ for an operating wavelength of 1.55 μm. The multi-mode waveguide would typically have a V-value (normalised frequency) of 2.8 which may be obtained, for example, with a core diameter of 3.3 μm and a core/cladding refractive index difference of $\Delta n=0.015$ again for an operating wavelength of 1.55 μm. The length of the multi-mode section in this case would need to be about 0.35 m to give a wavelength spacing between the peaks of about 1 nm.

In alternative embodiments the ring laser may be formed using a planar waveguide structure as described above with reference to FIGS. 6a & b.

In a further alternative, the multi-mode device is realised in a semiconductor waveguide structure as described above with reference to FIG. 7. Using such a structure a multi-mode length of 1 cm gives a wavelength spacing of about 7.7 nm at the operating wavelength of 1.5 μm.

Figure 14:
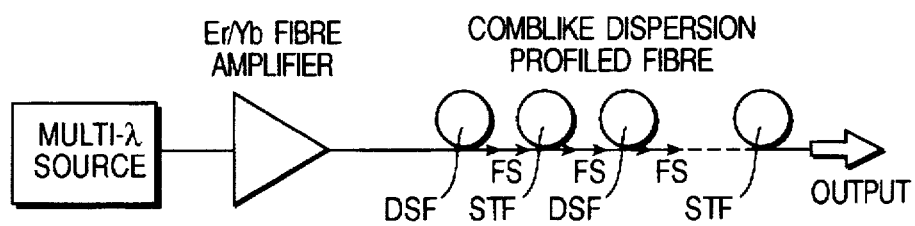
FIG. 14 shown a soliton pulse generator.

In a further alternative embodiment shown in FIG. 14, the multi-wavelength source, which may be constructed according to any of the alternatives described above, is used in a circuit for the generation of very short soliton pulses. The output from the multi-wavelength source is coupled into a comb like dispersion profile fibre (CDPP). This fibre consists of many alternating segments of two fibre types with high anomalous dispersion and minimum absolute dispersion at the operational wavelength. In the present example the fibre comprises segments of standard commercially available dispersion shifted fibre DSF and standard telecommunications fibre STF fusion spliced together alternately (DSP-STF-DSF-STF). The fibre consisted of 20 segments of total length 7.5 km. Beating between the different wavelengths from the source is transformed by the CDPF into compressed soliton pulses of short duration of about 2 ps. The use of CDPF in the generation of short soliton pulses is described further in the post-deadline paper by S. V. Cherinkov, R. Kashyap and J. R. Taylor presented at the Nonlinear Guided-Wave Phenomena conference, Cambridge, September 1993.

FIG. 13 shows a WDM communications systems incorporating a multiple-wavelength source of the type described above. The source is incorporated in the head-end station which outputs the multiple-wavelength signal onto a ladder network having a first arm extending to a plurality of sensors S1 . . . Sn and a second arm extending to a plurality of actuators. The sensors may, for example, be low data-rate devices, such as pressure transducers used in an industrial control system, in which case the actuators may be a control device associated with the system. Alternatively, or in addition, the actuators and sensors may simply be provided by the transmit and receive sides of a telephone for voice telephony. Each sensor or actuator selects the wavelength corresponding to its respective WDM channel using a Bragg fibre grating in the came of the sensors, or a band pass filter in the case of the actuators. In the case of the sensors, the selective channel in then intensity-modulated and the modulated signal returned via the network to the head-end station. In the case of the actuators, the respective channel is selected using an appropriately tuned narrow band pass filter and the selected channel is then demodulated.

This particular network is described by way of example only, and it will be appreciated that the multiple-wavelength sources of the present invention may be used in a wide variety of different network configurations. The network configuration shown in FIG. 13, and other alternative configurations are described in further detail in the present applicants co-pending international application PCT/GB 93/01130.

We claim:

1. An optical filter comprising:
   a multi-mode waveguide having a first number n modes and a second waveguide having a different number m modes coupled in series,
   where n and m are integers and n>m, the interaction of different modes at the n-mode/m-mode interface being effective to filter an optical signal propagating through the waveguides to provide a predetermined filter response characteristic, and
   means for changing a lateral offset between the central axes of the waveguides at their interface thereby controlling the response of the filter.

2. A filter according to claim 1, in which the second waveguide in a single-mode waveguide (i.e. m=1).

3. A filter according to claim 1, in which the means for changing the offset include a driving element mechanically coupled to one of the waveguides and arranged to displace one of the waveguides laterally in response to a control signal.

4. A filter according to claim 1 including a plurality of multi-mode waveguides coupled in series.

5. A filter according to claim 4, including a first multi-mode waveguide, a single-mode waveguide following the first multi-mode waveguide, and a second multi-mode waveguide following the single-mode waveguide.

6. A filter according to claim 5, in which the interface between the first multi-mode waveguide and the single-mode waveguide is arranged to have a respective first comb-filter characteristic, and the interface between the single-mode waveguide and second multi-mode waveguide is arranged to have a second comb-filter characteristic having a different characteristic wavelength spacing from the first comb-filter characteristic, transmission peaks of the first comb-filter characteristic and of the second comb-filter characteristic coinciding at a pre-determined transmission wavelength for the filter.

7. An optical communications system carrying a plurality of wavelength division multiplexing channels and including a filter according to claim 6 arranged to select a pre-determined channel at a node in the system.

8. A filter according to claim 1 in which one of the first and second waveguides is a fibre waveguide and the other of the first and second waveguides is a planar waveguide.

9. An optical system comprising a rare-earth doped fibre amplifier and an optical filter according to claim 1 connected to the output of the rare-earth doped fibre amplifier, the filter thereby flattening the gain-characteristic of the amplifier.

10. A multiple wavelength optical source comprising:
    an optical cavity including a laser gain medium and means for outputting a signal from the optical cavity, and
    a filter according to claim 1 coupled in the optical cavity.

the interaction of different modes at the n-mode/m-mode interface being effective to filter an optical signal propagating in the cavity thereby providing an output signal with multiple peaks at different wavelengths with a predetermined spacing.

11. A system according to claim 10, in which the gain medium is a rare-earth doped optical fibre.

12. A system according to claim 11 in which the doped fibre in a single-mode fibre and is coupled to a multi-mode fibre to provide tho required multi-mode single-mode interface.

13. A system according to claim 10, in which at least one of the gain medium and the waveguides are formed in a planar solid state device.

14. A system according to claim 10, in which the gain medium is provided by a semi-conductor laser amplifier.

15. A system according to claim 14, in which single-mode and multi-mode waveguides are also formed in one or more solid-state devices.

16. A system according to claim 10, further comprising means for modifying the effective refractive index of the optical cavity in response to a control signal.

17. A generator for soliton pulses comprising a multiple-wavelength source according to claim 10 coupled to a comb like dispersion profile fibre.

18. A wavelength division multiplexing optical communications system comprising:
   an optical source, and
   means for modulating different channels on different respective wavelengths from the multiple wavelength source, the optical source including a multiple wavelength optical source according to claim 10, the optical source providing an output signal with multiple peaks at different wavelengths corresponding to the different wavelength division multiplexing channels.

19. A method of filtering an optical signal, said method comprising:
   driving with the optical signal a first medium supporting n modes at the wavelength of the signal,
   coupling the output of the medium to a second medium supporting a different number m modes at the wavelength of the signal,
   where n and m are positive integers and n>m,
   the interaction of the modes at the n-mode/m-mode interface being effective to filter the signal providing a predetermined filter response characteristic, and
   changing the lateral offset between the central axes of the waveguides at their interface to provide a different desired response characteristic.

20. A method according to claim 19, in which the first medium supporting n modes is a multi-mode waveguide and the second medium supporting m modes is a single-mode waveguide.

21. A method according to claim 19, in which the optical signal is propagating in an optical cavity including a laser gain medium, the method further comprising outputting the filtered optical signal thereby providing a signal with multiple peaks at different wavelengths with a predetermined spacing.

22. A multiple wavelength optical source comprising:
   an optical cavity including a laser gain medium,
   means for outputting a signal from the optical cavity, and
   an n-mode waveguide and an m-mode waveguide coupled in series in the optical cavity, where n and m are integers corresponding to the respective numbers of spatial modes supported by the waveguides and n>m,
   the interaction of different modes at the n-mode/m-mode interface being effective to filter an optical signal propagating in the cavity to provide an output signal with multiple peaks at different wavelengths with a predetermined spacing.

23. An optical filter comprising:
   a multimode waveguide having a first number n-modes and a second waveguide having a different number m-modes coupled in series,
   where n and m are integers and n is greater than m, the interaction of different modes at the n-mode/m-mode interface being effective to filter an optical signal propagating through the waveguides to provide a predetermined filter response characteristic,
   the optical filter including a plurality of multimode waveguides coupled in series and arranged to provide a wavelength-sensitive mode overlap to effect wavelength filtering.

24. A filter according to claim 23, including a first multi-mode waveguide, a single-mode waveguide following the first multi-mode waveguide, and a second multi-mode waveguide following the single-mode waveguide.

25. An optical filter comprising:
   a multimode waveguide having a first number n-modes and a second waveguide having a different number m-modes coupled in series,
   wherein n and m are integers and n is greater than m, the interaction of different modes at the n-mode/m-mode interface being effective to filter an optical signal propagating through the waveguides to provide a desired response characteristic,
   the optical filter comprising a plurality of multimode waveguides coupled in series,
   a first multimode waveguide of said plurality of multimode waveguides being followed by a single-mode waveguide, and a second multi-mode waveguide of said plurality of multimode waveguides following the single-mode waveguide,
   the interface between the first multi-mode waveguide and the single-mode waveguide being arranged to have a respective first comb-filter characteristic, and
   the interface between the single-mode waveguide and the second multi-mode waveguide being arranged to have a second comb-filter characteristic having a different characteristic wavelength spacing from the first-comb-filter characteristic, transmission peaks of the first comb-filter characteristic and of the second comb-filter characteristic coinciding at a pre-determined transmission wavelength for the filter.

26. An optical filter comprising:
   a multimode waveguide having a first number n-modes and second waveguide having a different number m-modes coupled in series,
   where n and m are integers and n is greater than m, the interaction of different modes at the n-mode/m-mode interface being effective to filter an optical signal propagating through the waveguides to provide a desired response characteristic,
   one of the first and second waveguides being a fibre waveguide, and
   the other of the first and second waveguides being a planar waveguide.

27. A filter according to claim 26, in which the fibre waveguide is a single-mode waveguide, and the planar waveguide is a multiple-mode waveguide.

28. An optical communication system carrying a plurality of wavelength division multiplexing channels and including a filter according to claim 26 arranged to select a predetermined channel at a node in the system.

29. An optical filter comprising:
   a first multi-mode waveguide having a first number n modes,
   a second multi-mode waveguide having a different number m modes coupled in series with said fist multi-mode waveguide, where n and m are integers and n>m, and where the interaction of different modes at the n-mode/m-mode interface is effective to filter an optical signal propagating through the waveguides to provide a predetermined filter response characteristic, and
   a laterally offsettable stage mechanically fixed with respect to at least one of said multi-mode waveguides and disposed to change an effective lateral offset between central axes of the waveguides at their interface, thereby controlling the response of the filter.

30. A filter according to claim 29, in which a single-mode waveguide is interposed serially between said multi-mode waveguides and also mechanically coupled to said laterally offsetable stage.

31. A multiple wavelength optical source comprising:
   an optical cavity including a laser gain medium,
   a coupler for outputting a signal from the optical cavity,
   an optical filter including an n-mode waveguide and a serially coupled m-mode waveguide in the optical cavity, where n and m are integers corresponding to the respective numbers of spatial modes supported by the waveguides, n>m, and the interaction of different modes at the n-mode/m-mode interface being effective to filter an optical signal propagating in the cavity to provide an output signal with multiple peaks at different wavelengths with a predetermined spacing.

* * * * *

UNITED STATES PATENT AND TRADEMARK OFFICE
CERTIFICATE OF CORRECTION

PATENT NO. : 5,796,891
DATED : August 18, 1998
INVENTOR(S) : Poustie, et. al.

It is certified that error appears in the above-indentified patent and that said Letters Patent is hereby corrected as shown below:

Title page, item [73], Assignee: should read --British Communications public limited company--.

Signed and Sealed this

Nineteenth Day of October, 1999

Attest:

Q. TODD DICKINSON

*Attesting Officer*   *Acting Commissioner of Patents and Trademarks*

UNITED STATES PATENT AND TRADEMARK OFFICE
CERTIFICATE OF CORRECTION

PATENT NO. : 5,796,891
DATED : August 18, 1998
INVENTOR(S) : Poustie, et. al.

It is certified that error appears in the above-identified patent and that said Letters Patent is hereby corrected as shown below:

Title page, item [73], Assignee: should read --British Telecommunications public limited company --

This certificate supersedes Certificate of Correction issued October 19, 1999.

Signed and Sealed this

Twenty-ninth Day of February, 2000

Attest:

Q. TODD DICKINSON

*Attesting Officer*      *Commissioner of Patents and Trademarks*